United States Patent
Gunji et al.

(10) Patent No.: US 8,446,160 B2
(45) Date of Patent: May 21, 2013

(54) PROBE CARD MAINTENANCE METHOD WHICH ADJUSTS POSITION/POSTURE OF PROBES

(75) Inventors: Katsuhiro Gunji, Miyazaki (JP); Toru Iwasaki, Miyazaki (JP); Tatsurou Nagai, Miyazaki (JP); Yumi Kodama, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 630 days.

(21) Appl. No.: 12/697,632

(22) Filed: Feb. 1, 2010

(65) Prior Publication Data
US 2010/0196136 A1  Aug. 5, 2010

(30) Foreign Application Priority Data
Feb. 5, 2009  (JP) .................................. 2009-025030

(51) Int. Cl.
*G01R 31/00* (2006.01)
(52) U.S. Cl.
USPC ............. 324/750.16; 324/750.01; 324/750.03
(58) Field of Classification Search
None
See application file for complete search history.

(56) References Cited

U.S. PATENT DOCUMENTS

| | | | | |
|---|---|---|---|---|
| 5,124,639 | A * | 6/1992 | Carlin et al. | 324/750.03 |
| 6,349,396 | B2 * | 2/2002 | Akram | 714/724 |
| 6,474,350 | B1 * | 11/2002 | Mizuta | 134/56 R |
| 2007/0268029 | A1 * | 11/2007 | McClanahan et al. | 324/754 |

FOREIGN PATENT DOCUMENTS

| | | |
|---|---|---|
| JP | 10-092885 | 4/1998 |
| JP | 2005-079253 | 3/2005 |

* cited by examiner

*Primary Examiner* — Vinh Nguyen
(74) *Attorney, Agent, or Firm* — Volentine & Whitt, PLLC

(57) ABSTRACT

An improved probe card maintenance method is capable of accurately, rapidly, and easily performing the maintenance of a probe card. The probe card is a jig adapted to test the electrical properties of semiconductor integrated circuits. The electrical properties of the semiconductor integrated circuits are tested at a predetermined test temperature. The probe card has a plurality of probes thereon. The probe card maintenance method includes heating the probe card and the probes on the probe card to the same temperature as the test temperature. The method also includes adjusting positions and postures of the defective probes while maintaining the temperature of the probe card and the probes at the test temperature.

16 Claims, 6 Drawing Sheets

PROBE CARD MAINTENANCE METHOD WHICH ADJUSTS POSITION/POSTURE OF PROBES

BACKGROUND OF THE INVENTION

1. Field of the Invention

The present invention relates to a maintenance method of a probe card. The probe card is a jig designed to test the electrical properties and characteristics of a plurality of semiconductor integrated circuits formed on a wafer.

2. Description of the Related Art

When a plurality of semiconductor integrated circuits are formed on a wafer in a process of manufacturing a semiconductor device, electrical properties of the semiconductor integrated circuits in the wafer state are tested before the wafer is cut into a plurality of pieces (chips) by dicing. A probe card having a plurality of probes thereon is used for the testing. In testing the electrical properties of the semiconductor integrated circuits, the wafer having the semiconductor integrated circuits formed thereon is placed on a measurement stage of a prober, the probes of the probe card come into contact with external electrode drawing-out pads on the semiconductor integrated circuits, and the electrical properties of the semiconductor integrated circuits are measured. It is possible to determine whether each semiconductor integrated circuit (that is, each chip) possess desired electrical properties or not through such measurement. Screening of defective semiconductor integrated circuits is performed based on the determination.

In the measurement performed with the probe card, the probes must contact the external electrode drawing-out pads of the semiconductor integrated circuits a plurality of times, with the result that tip ends of the respective probes may be bent and/or positionally misaligned. When such bending and/or position misalignment occurs at the tip ends of the probes, it is not possible to accurately measure the electrical properties of the semiconductor integrated circuits.

In general, the measurement with the probe card is carried out at high temperature (for example, 100° C. (degrees C.) or higher). Therefore, foreign matter, such as solder particles (bump scrap) of the external electrode drawing-out pads, may attach to the probes as the measurement is carried out repeatedly. If foreign matters adhere to the probes, it is not possible to accurately measure the electrical properties of the semiconductor integrated circuits.

A test apparatus (prober) and a cleaning method to cope with the above-mentioned problems are disclosed in Japanese Patent Application Kokai (Publication) No. 2005-79253 and Japanese Patent Application Kokai No. 10-92885. In Japanese Patent Application Kokai No. 2005-79253, the positions of probes in the test apparatus are detected, and the alignment between a wafer and a probe card is accurately and rapidly performed based on the detection result. Because the technology of Japanese Patent Application Kokai No. 2005-79253 detects the probe positions in the test apparatus, it is possible to know the probe positions during the testing at high temperature. The technology of Japanese Patent Application Kokai No. 10-92885 heats the probes in a test apparatus to melt bump scrap attached to the probes, and the probes are ground. Since tip ends of the probes are heated to a temperature sufficient to melt the bump scrap, it is possible to easily remove the bump scrap from the probes.

SUMMARY OF THE INVENTION

The conventional art can accurately and rapidly perform the alignment between the probe card and the wafer. However, it is difficult to accurately, rapidly, and easily find and/or correct bending and position misalignment of the probes.

It is an object of the present invention to provide a probe card maintenance method that is capable of accurately, quickly and easily performing the maintenance of a probe card designed to test the electrical properties of semiconductor integrated circuits.

According to one aspect of the present invention, there is provided a novel probe card maintenance method. The probe card has a plurality of probes thereon. The probe card is used during testing of electrical properties of a wafer (or semiconductor integrated circuits on the wafer). The test is carried out at a predetermined temperature (referred to as "test temperature"). The probe card maintenance method includes heating the probe card and/or the probes to the same temperature as the test temperature. The probe card maintenance method also includes adjusting positions/postures of the defective probes while maintaining the temperature of the probe card and/or the probes at the test temperature.

The probe card maintenance method of the present invention heats the probe card and probes to the same temperature as the wafer test temperature, and adjusts (corrects) the positions/postures of the probes while maintaining the temperature of the probe card and/or the probes at the test temperature. Consequently, it is possible to accurately, rapidly, and easily perform the maintenance of the probe card and probes.

The adjusting of the positions and postures of the probes may include preparing a glass mask having a plurality of alignment marks indicating original positions and postures of the probes of the probe card respectively. The adjusting of the positions and postures of the probes may also include locating the glass mask such that the glass mask faces the probe card. The adjusting of the positions and postures of the probes may also include adjusting the positions and postures of the probes such that tip ends of the probes coincide with the corresponding alignment marks.

The maintenance method may further include preparing a maintenance table equipped with a heater prior to the heating the probe card and probes. The heating of the probe card and probes may include placing the probe card on the maintenance table, and heating the probe card and probes with the heater.

The maintenance method may further include cleaning the probes before or after heating the probe card and probes, or after adjusting the positions and postures of the probes.

The maintenance method may further include heating the probe card and probes between the adjusting the positions and postures of the probes and the cleaning the probes.

The maintenance method may further include finding defective probes among the probes prior to the adjusting positions and postures of the probes. The defective probes are those probes whose tip ends are not in originally designed positions and postures. The adjusting of positions and postures of the probes may be carried out to the defective probes only.

The testing may be carried out in a testing apparatus. The maintenance table may be located outside the testing apparatus. The maintenance method may further include removing the probe card from the testing apparatus prior to the placing the probe card on the maintenance table and returning the probe card to the testing apparatus after the adjusting positions and postures of the probes.

The cleaning of the probes may include applying forced air to the probes and/or heating the probes.

The heating in cleaning the probes may include heating the probes to a temperature higher than the test temperature.

These and other objects, aspects and features of the present invention will become apparent to those skilled in the art from the following detailed description when read and understood in conjunction with the appended claims and drawings.

DETAILED DESCRIPTION OF THE INVENTION

Now, exemplary embodiments of a probe card maintenance method according to the present invention will be described in detail with reference to FIGS. 1 to 6.

First Embodiment

A probe card maintenance method according to a first embodiment of the present invention, which is performed during wafer testing, will be described with reference to FIGS. 1 to 5B.

Figure 1:
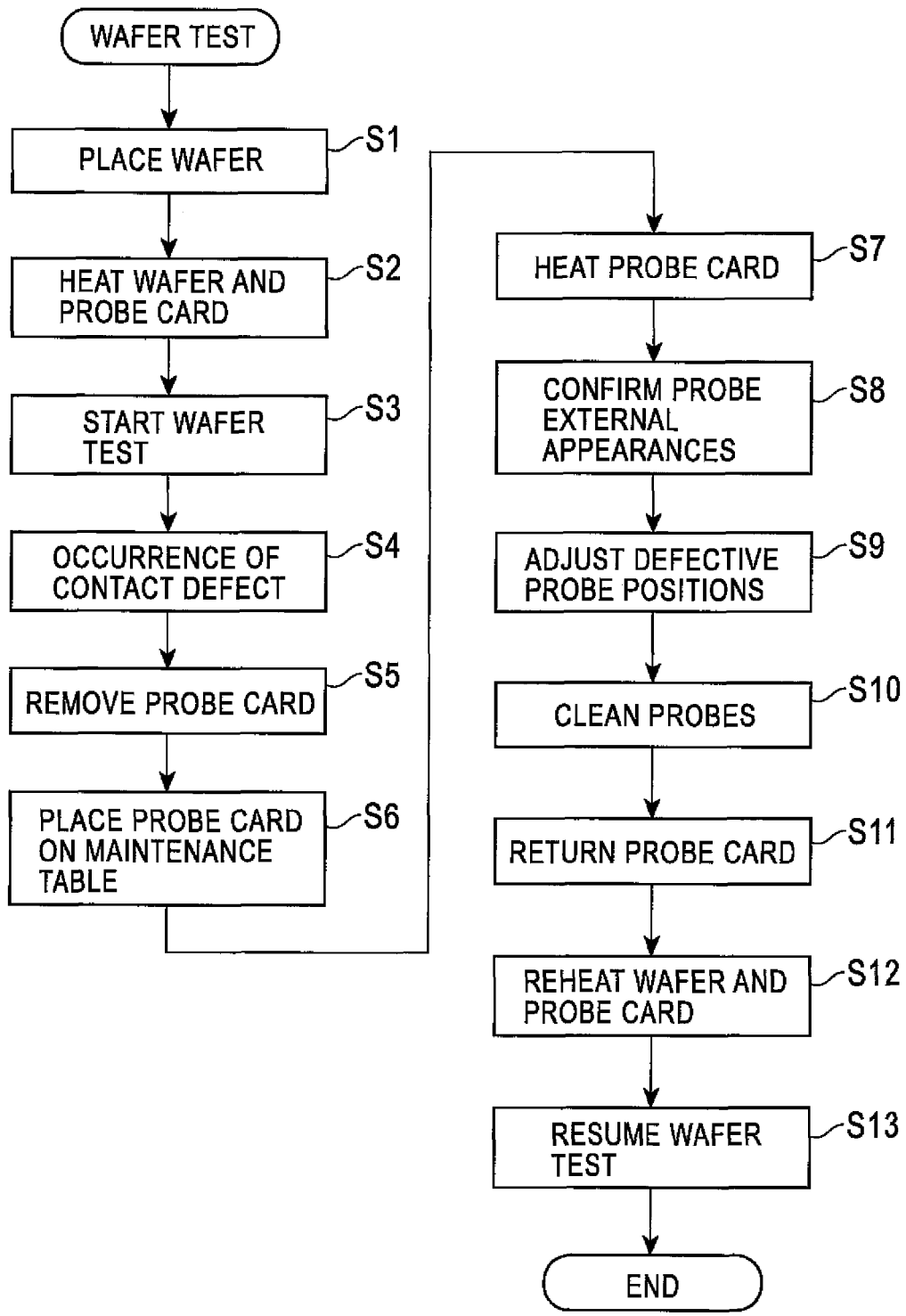
FIG. 1 is a flow chart illustrating a testing procedure for a semiconductor wafer, using a probe card maintenance method according to a first embodiment of the present invention.
Figure 2:
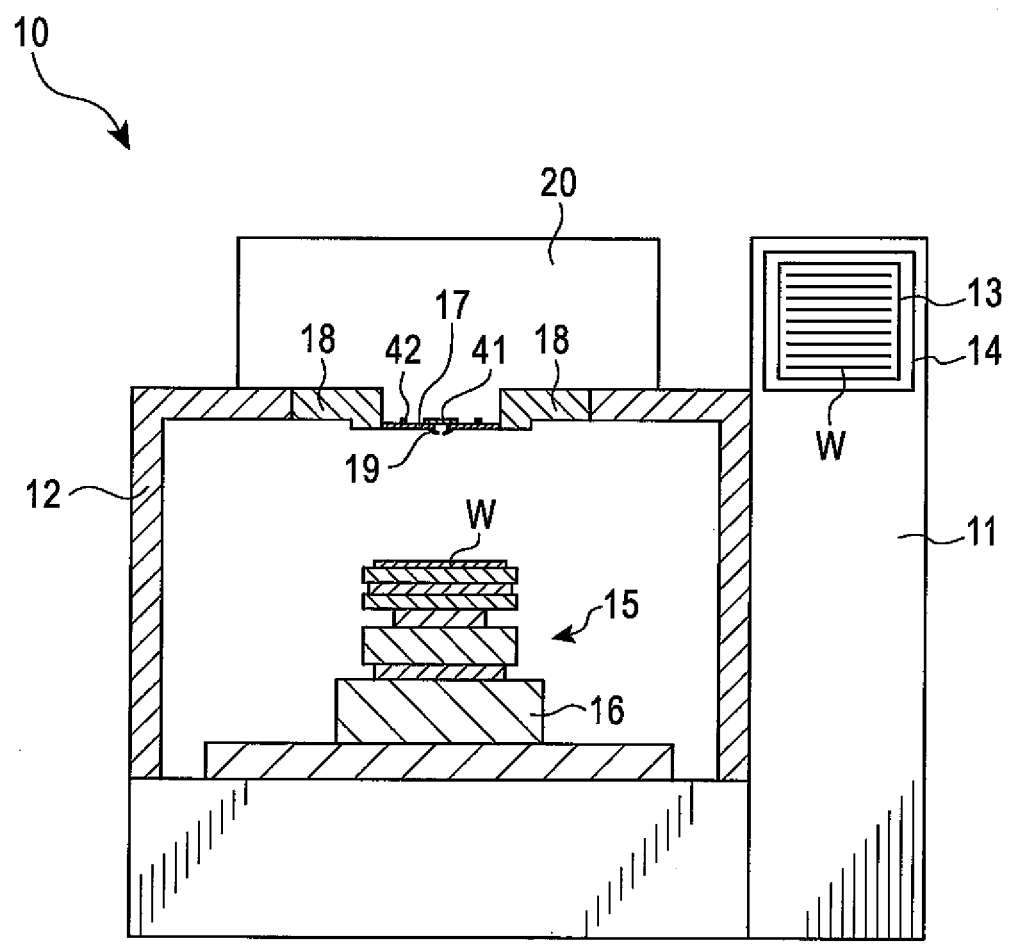
FIG. 2 is a cross-sectional view of a prober used for a wafer test in the first embodiment of the present invention.

Referring first to FIG. 2, in order to measure electrical properties of a wafer W having a plurality of semiconductor integrated circuits formed thereon, the wafer W is placed in a prober 10 (FIG. 1: Step S1). The prober 10 is a test apparatus (measurement apparatus) for testing (measuring) the wafer property. The placement of the wafer W in the prober 10 will be described in detail.

The construction of the prober 10 will be described with reference to FIG. 2. As shown in FIG. 2, the prober 10 includes a loader chamber 11 to carry the wafer W and a prober chamber 12 disposed next to the loader chamber 11 to measure (test) the electrical properties of the wafer W. A cassette receiving part 14 to receive a wafer cassette 13 and a wafer transfer mechanism (not shown) are provided in the loader chamber 11. A plurality of wafers W are stored or stacked in the cassette 13. A placement table 15, a support table 16, a probe card 17 and a head plate 18 are provided in the prober chamber 12. The wafer W is placed on the placement table 15. The wafer placement table 15 has an elevating mechanism (not shown) for its vertical movement. The support table 16 supports the placement table 15. The support table 16 has a sliding or translating mechanism (not shown) for its movement in a horizontal plane. The probe card 17 is supported by the head plate 18 of the prober chamber 12 and disposed above the placement table 15. The probe card 17 has an opening at the central portion thereof. This opening is closed by a plate 41. The plate 41 reinforces the structural strength of the probe card 17. The reinforcement plate 41 is provided at the side opposite the side of the probe card 17 where the probes 19 are provided. A plurality of probes 19 are provided at the central part of the probe card 17. The probes 19 extend diagonally downward and inward from the surface of the probe card 17 at predetermined angle when the probe card 17 is installed in the prober 10. The probes 19 have designed posture. Components 42, such as a relay or a resistor, are provided on the probe card 17 around the reinforcement plate 41. The head plate 18 detachably holds the probe card 17. Fixing and detaching the probe card 17 to and from the head plate 18 may be achieved with screws (not shown). A test head 20 is connected to the probe card 17. A temperature control arrangement (not shown), including, for example, a heater and a cooling jacket, is built in each of the placement table 15 and the head plate 18. The temperature of the wafer W and the probe card 17 is controlled to a desired measurement temperature by the temperature control arrangement. Since the placement table 15 has the elevating mechanism, the placement table 15 can move upward and downward (in the vertical direction). The support table 16 can move in the plane parallel to the surface of the wafer W (that is, in the horizontal plane).

The placement of the wafer W onto the wafer table 15 from the cassette 13 is performed as follows. First, a plurality of wafers W are stored in the cassette 13. Next, the cassette 13 is received in the cassette receiving part 14 of the loader chamber 11. Subsequently, one of the wafers W stacked in the cassette 13 is carried into the prober chamber 12 by the wafer carriage mechanism, and is placed on the placement table 15. In this way, the placement of the wafer W in the prober 10 is completed.

Next, the wafer W and the probe card 17 are heated to a predetermined test temperature (measurement temperature) (FIG. 1: Step S2). The wafer W is heated by the temperature control unit built in the placement table 15, and the probe card 17 is heated by the temperature control unit built in the head plate 18. It should be noted that another temperature control unit may be provided in the prober chamber 12 to control the interior temperature of the prober chamber 12 such that the temperature of the wafer W and the probe card 17 can be controlled to the predetermined test temperature through the control of the interior temperature of the prober chamber 12. In such a case, the placement table 15 and/or the head plate 18 may or may not have the temperature control unit(s).

When the test temperature of the wafer W and the probe card 17 is reached, the measurement of the electrical properties of semiconductor integrated circuits (not shown) formed on the wafer W (referred to as "wafer test") is performed (FIG. 1: Step S3). Specifically, the position alignment between the wafer W and the probe card 17 is performed by moving the support table 16 in the horizontal plane. Subsequently, the placement table 15 is caused to approach the probe card 17 (that is, the placement table 15 is moved upward) until external electrode drawing-out pads (not shown) on the semiconductor integrated circuits come into contact with the probes 19. In this state, the measurement of the electrical properties of the semiconductor integrated circuits becomes possible. A tester (not shown) is connected to the probe card 17 via the test head 20. A signal provided by the tester for electrical property measurement is applied to the external electrode drawing-out pads on the wafer W through the probes 19 so as to measure the electrical properties of the semiconductor integrated circuits formed on the wafer W.

It should be assumed here that a contact defect between the external electrode drawing-out pads on the wafer W and the probes 19 occurs during the wafer test (FIG. 1: Step S4). When such contact defect occurs, it is not possible to accurately measure the electrical properties of the semiconductor integrated circuits formed on the wafer W. For example, the contact defect may occur due to bending or position misalignment of the probes 19 after repeated use of the probe card 17 (repeated contact between the probes 19 and the external electrode drawing-out pads on the wafer W). When such bending or position misalignment occurs in the probes 19, mere movement of the support table 16 in the horizontal plane may not be able to overcome the contact defect between the probe card 17 and the wafer W. This is because, if the re-alignment between the probe card 17 and the wafer W is performed based on a particular defective probe 19 for the purpose of curing the contact defect between that particular probe and the associated external electrode drawing-out pad, then other probes 19 may not be able to maintain the appropriate contact with the associated external electrode drawing-out pads. Thus, another contact defect occurs. It should be noted that the contact defect may occur when foreign particles, such as solder particles (bump scrap) of the external electrode drawing-out pads, adhere to the probes 19.

In order to eliminate the contact defect caused by the bending and position misalignment of the probes 19, the following maintenance procedure is performed with respect to the probe card 17 in this embodiment. First, the wafer W is separated from the probes 19 by moving the placement table 15 downward, and the probe card 17 is removed from the head plate 18 (FIG. 1: Step S5). The probe card 17 can be detached from the head plate 18 by unscrewing, and therefore, it is easy to remove the probe card 17 from the head plate 18.

Next, the removed probe card 17 is placed on a maintenance table 30 (FIG. 3A) (FIG. 1: Step S6). The placement of the probe card 17 on the maintenance table 30 will be described in detail.

Figure 3A:
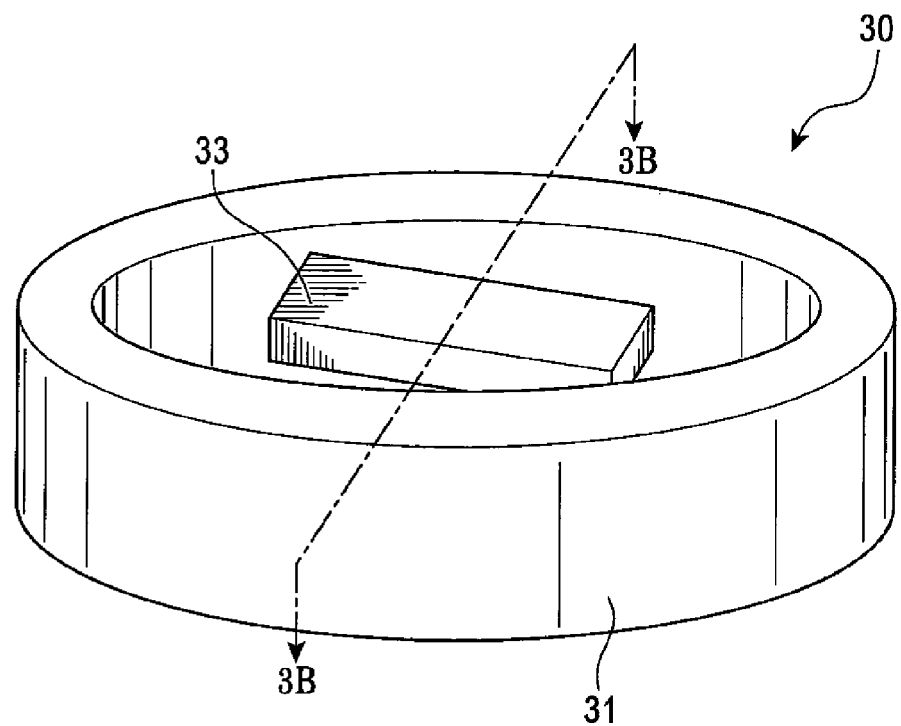
FIG. 3A is a perspective view of a maintenance table used in the maintenance method of the first embodiment of the present invention.
Figure 3B:
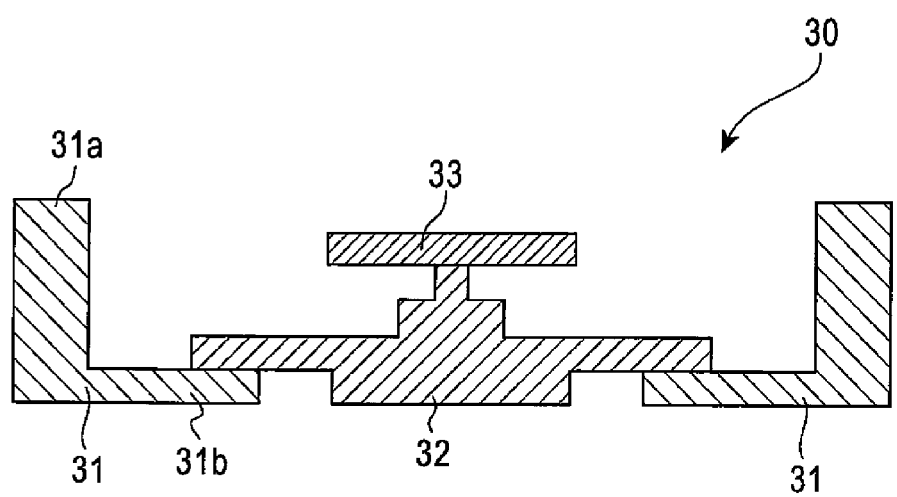
FIG. 3B is a cross-sectional view taken along the line 3B-3B in FIG. 3A.

First, the construction of the maintenance table 30, on which the probe card 17 will be placed, will be described with reference to FIGS. 3A and 3B. FIG. 3A is a perspective view of the maintenance table 30, and FIG. 3B is a cross-sectional view taken along the line 3B-3B (indicated by a dashed dotted line) of FIG. 3A. As shown in FIGS. 3A and 3B, the maintenance table 30 includes a probe card support part 31, a heater fixing part 32, and a heater 33. The probe card support part 31 has a cylindrical side wall 31a and a bottom 31b. The bottom 31b has an opening at the central portion thereof. The heater fixing part 32 is secured to the bottom 31b of the probe card support 31 and closes the bottom opening of the probe card support 31. The heater 33 is disposed on the center piece of the heater fixing part 32. The heater 33 has, for example, a rectangle parallelepiped shape. The heater 33 is surrounded by (or received in) the probe card support 31. Thus, the radiation of heat generated from the heater 33 to the outside is restricted. Therefore, it is possible to heat the probe card 17 and probes 19 by the heater 33 with high efficiency (will be described later). A control device (not shown) is connected to the heater 33 to control the temperature of the heater 33.

Figure 4:
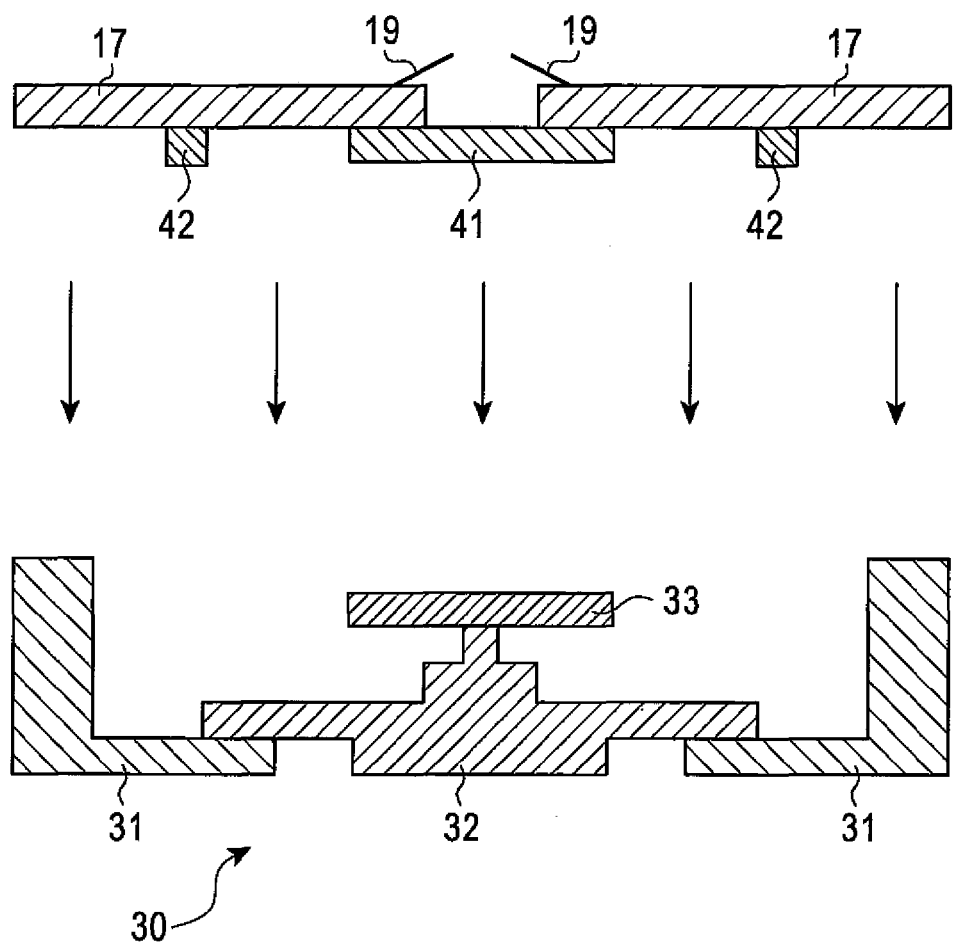
FIG. 4 is a cross-sectional view illustrating one step in the probe card maintenance method of the first embodiment, with a probe card being placed on the maintenance table shown in FIG. 3B.
Figure 5A:
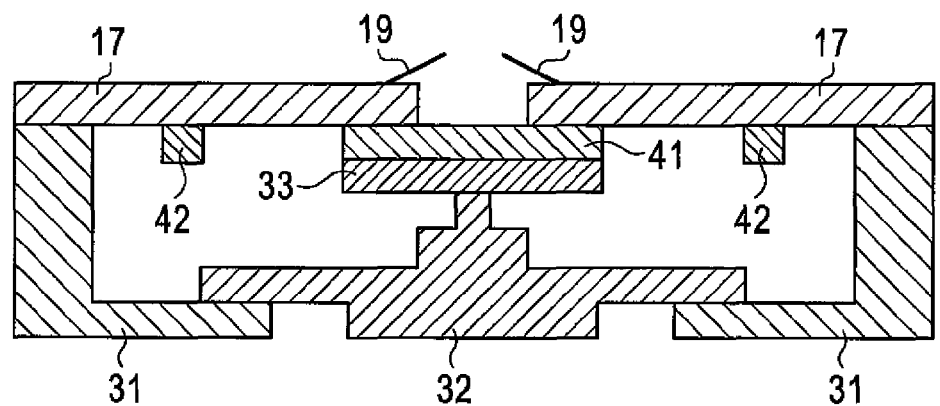
FIG. 5A is a cross-sectional view illustrating another step in the probe card maintenance method of the first embodiment.

The placement of the probe card 17 onto the maintenance table 30 is performed as follows. As shown in FIG. 4, the probe card 17 is placed on the maintenance table 30 with its upside down. Thus, the upper face of the probe card 17, which is opposite the face having the probes 19, contacts the maintenance table 30. The probes 19 are originally designed to incline with respect to the surface of the probe card 17 at the predetermined angle. When the probe card 17 is placed on the maintenance table 30, the edge of the probe card 17 is in contact with the probe card support 31 of the maintenance table 30, and the reinforcement plate 41 is in contact with the heater 33, as shown in FIG. 5A.

After the probe card 17 is placed on the maintenance table 30, heat is supplied from the heater 33 to the probe card 17 via the reinforcement plate 41. Therefore, the probe card 17 and probes 19 are heated (FIG. 1: Step S7). The heating of the probe card 17 and probes 19 is controlled by the control device connected to the heater 33. For example, the control device may control the heater 33 to heat the probe card 17 and probes 19 such that the probe card 17 and probes 19 reach the same temperature as the wafer test temperature (for example, about 100° C.). When the probe card 17 is heated, the components 42 mounted on the probe card 17 are also heated. It should be noted that the heater 33 may be arranged to directly heat the probe card 17 without heating the reinforcement plate 41. It should also be noted that the probe card 17 may not have a center opening and the reinforcement plate 71 may be dispensed with.

When the temperature of the probe card 17 and probes 19 is raised to the predetermined test temperature, external appearance confirmation/inspection and position/posture adjustment are performed with respect to the probes 19 in order to fine defective probes which have caused the contact defect at Step S4, while the test temperature is maintained. An example of the external appearance confirmation and position/posture adjustment of the probes 19 will be described below in detail.

Figure 5B:
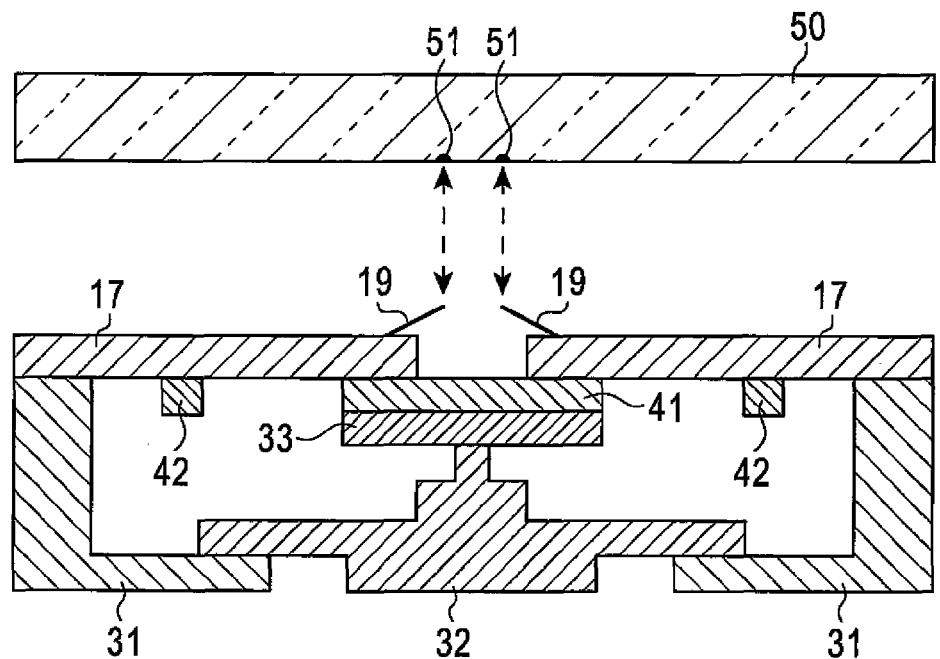
FIG. 5B is a cross-sectional view illustrating still another step in the probe card maintenance method of the first embodiment.

First, the external appearance confirmation of the probes 19 is performed (FIG. 1: Step S8). Specifically, position/posture confirmation (inspection) of the tip ends of the probes 19 is performed using a glass mask 50 having alignment marks 51 (FIG. 5B). The alignment marks 51 indicate where the tip ends of the probes 19 should be located (pointed). In this position/posture confirmation, a probe card test device (for example, Precision Point Vision X (PRVX)) or a microscope is used. Whether the tip ends of the probes 19 are damaged (including being broken, bent and misaligned) or not is also inspected using the probe card test device or the microscope. Since the temperature of the probes 19 is maintained at the same temperature as the test temperature (about 100 degrees C.) that is reached as a result of the heating performed in Step S7, it is possible to perform the external appearance confirmation of the probes 19 in (under) a condition approximate to a condition in which the probes 19 are actually used in the prober 10. In other words, it is feasible to perform the external appearance confirmation of the probes 19 with high precision.

Next, the position/posture adjustment of the probes 19 is performed (FIG. 1: Step S9). The position/posture adjustment of the probes 19 is performed using the glass mask 50. The alignment marks 51, which are indicia indicating where the tip ends of the probes 19 should be present. The glass mask 50 is positioned to face the probe card 17, and the position/posture adjustment of the defective probes 19 is performed such that all the tip, ends of the probes 19 coincide with the corresponding alignment marks 51 of the glass mask 50. Specifically, a testing person watches the probes 19 and the alignment marks 51 through the microscope, and changes (corrects) the position/posture of the defective probes 19 using a tool, such as a pincette. Through this position/posture adjustment of the probes 19, the bent or positionally misaligned probes 10 are corrected (returned to an original posture) so that the appropriate measurement of the electrical properties of the semiconductor circuits can be performed.

Since the position/posture adjustment of the probes 19 at this Step S9 is carried out at the same temperature as the wafer test temperature, it is possible to perform accurate position/posture adjustment of the probes 19 in consideration of thermal expansion of the probe card 17 and probes 19 during the wafer test.

When the position/posture adjustment of the probes 19 is completed, the probes 19 are cleaned (FIG. 1: Step S10). The cleaning of the probes 19 is performed, for example, using a tool, such as a brush or a pincette. Alternatively, the cleaning of the probes 19 may be performed using forced air. The cleaning of the probes 19 at this Step S10 is performed at the same temperature as the wafer test temperature. Thus, foreign matter, such as bump scrap, having melted and attached to the tip ends of the probes 19 is melted again. As a result, the foreign matter, such as the bump scrap, attached to the tip ends of the probes 19 is easily removed from the probes 19. The components 42 provided on the probe card 17 are also heated, so that it is possible to easily remove foreign matter from the components 42. In this way, unnecessary substances are entirely removed from the probe card 17, and therefore the wafer test can be accurately performed with high precision.

It should be noted that if the bump scrap is not melted at the temperature in Step 9 (about 100 degrees C.), additional heat may be supplied from the heater 33 to further increase the temperature of the probe card 17 and probes 19. Through further heating of the probe card 17 and probes 19, it is possible to easily remove foreign matter, such as bump scrap, which cannot be removed at the same temperature as the wafer test temperature. In other words, the probe cleaning step S10 may include heating the probe card 17 and probes 19 to a temperature higher than the test temperature. The probe cleaning step S10 may include all or any combination of removing foreign matter from the probe card 17 and probes 19 with brush or pincer, applying forced air to the probe card and probes and heating the probe card and probes.

When the cleaning of the probes 19 is completed, the probe card 17 is mounted to the prober 10 again (FIG. 1: Step S11). The probe card 7 is fixed to the head plate 18 by the fixing members, such as screws.

Next, the wafer W and probe card 17 are heated to the predetermined test temperature (measurement temperature) again (FIG. 1: Step S12). In the same manner as at Step S2 heating the wafer W and the probe card 17, the wafer W is heated by the temperature control unit built in the placement table 15, and the probe card 17 is heated by the temperature control unit built in the head plate 18. It should be noted that the wafer W remains in the prober 10 in a heated state from Step S2 to Step S12. Also, the probe card 17 is in a heated state in the position/posture adjustment step S9 and the cleaning step S10. As a result, it is possible to reduce time necessary to reheat the wafer W and the probe card 17 to the predetermined temperature after the probe card 17 returns to the prober 10, as compared with a case in which the probe card 17 is position/posture-adjusted and/or cleaned at room temperature and is returned (remounted) to the prober 10.

When the reheating of the wafer W and the probe card 17 is completed, the wafer test is resumed (FIG. 1: Step S13). In the same manner as at the above-described wafer test step (Step S3), the position adjustment (alignment) between the wafer W and the probe card 17 is performed by moving the support table 16 in the horizontal plane. Subsequently, the placement table 15 is caused to approach the probe card 17 until the external electrode drawing-out pads of the semiconductor integrated circuits come into contact with the probes 19. In this state, the measurement of the electrical properties of the semiconductor integrated circuits becomes possible. In addition, a signal for measurement is supplied from the tester to the external electrode drawing-out pads on the wafer W through the probes 19 so as to measure the electrical properties of the semiconductor integrated circuits formed on the wafer W.

In the above-described probe card maintenance method, the probe card 17 and the probes 19 mounted on the probe card 17 are heated to the same temperature as the test temperature (temperature at which the test of the electrical properties of the wafer W is carried out), the position/posture adjustment of the defective probes 19 is performed while the temperature of the probe card 17 and/or probes 19 is maintained at the test temperature. Since the probe card maintenance method includes the above-described steps, it is possible to perform maintenance of the probe card and probes in consideration of the thermal expansion of the probe card and the probes. Also, the probe card maintenance method does not require that the probe card 17 be fixed to the prober 10 during the maintenance procedure (Steps S6 to S10). Therefore, it is possible to quickly and easily perform the maintenance (position and posture correction and cleaning) of the probe card 17 and probes 19.

It should be noted that although the probe card 17 and probes 19 are heated by the heater 33 provided in the maintenance table 30 in the illustrated embodiment, the present invention is not limited in this regard so long as the probe card 17 and probes 19 can be heated. For example, if the maintenance table 30 is not equipped with the heater 33, the probe card 17 and probes 19 may be heated by a separate heater provided outside the maintenance table 30 with the probe card 17 being placed on the maintenance table 30.

Second Embodiment

In the first embodiment, the maintenance of the probe card 17 is performed during the testing of the wafer; however, the probe card maintenance method of the present invention may also be used before the wafer test, namely when receiving the probe card 17 from a remote factory. In the second embodiment, a receipt test of the probe card 17 using the probe card maintenance method according to the present invention will be described with reference to FIG. 6. The maintenance table 30 and glass mask 50 shown in FIG. 3A to FIG. 5B are also used in this embodiment. The probe card 17 will be mounted in the prober 10 after the receipt test.

Figure 6:
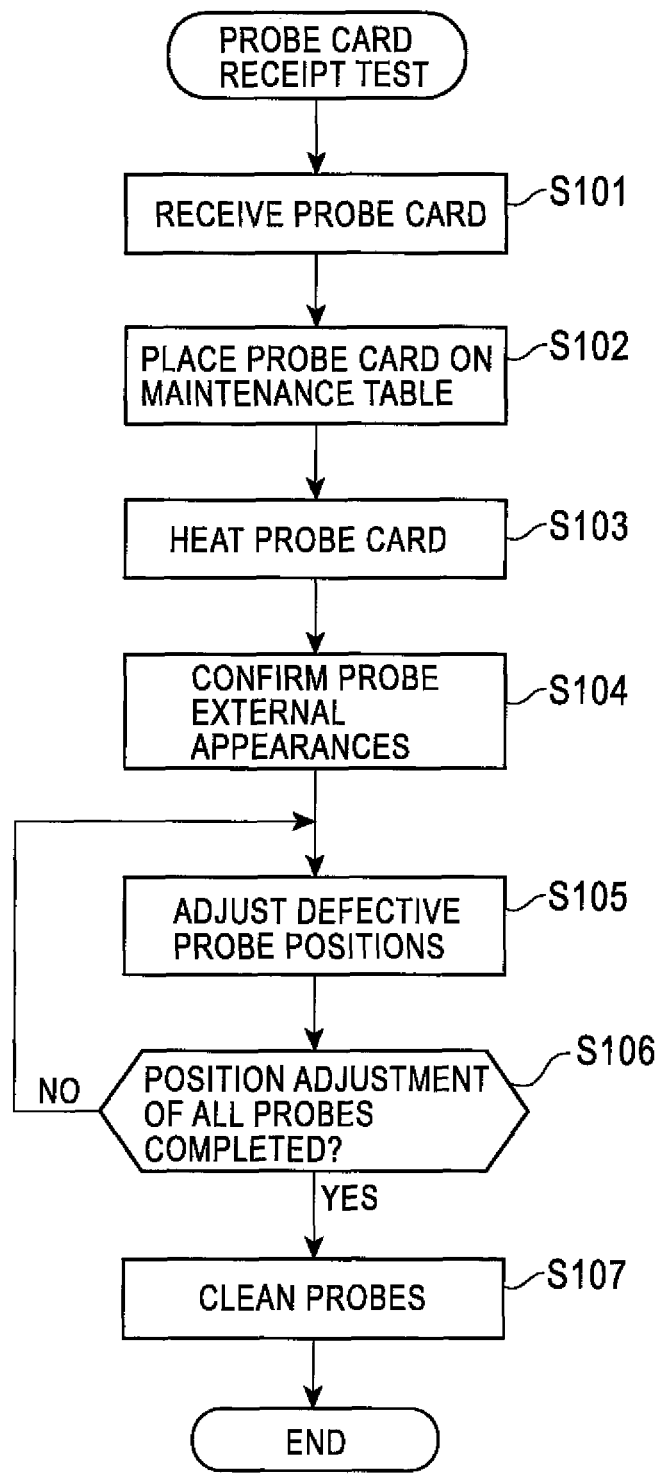
FIG. 6 is a flow chart illustrating an acceptance test of a probe card using a probe card maintenance method according to a second embodiment of the present invention.

First, the probe card 17 is received from a probe card supplier (FIG. 6: Step S101). Next, the received probe card 17 is placed on the maintenance table 30 (FIG. 6: Step S102). The placing of the probe card 17 on the maintenance table 30 is carried out in the same manner as in the first embodiment, and therefore, a description thereof is omitted.

After the probe card 17 is placed on the maintenance table 30, heat is supplied from the heater 33 to the probe card 17 via the reinforcement plate 41. Thus, the probe card 17 and probes 19 are heated (FIG. 6: Step S103). The heating of the probe card 17 and probes 19 is controlled by the control device connected to the heater 33. For example, the control device may control the heater 33 to heat the probe card 17 and probes 19 such that the probe card 17 and probes 19 reach the same temperature as the wafer test temperature (about 100 degrees C.).

When the probe card 17 and probes 19 are heated to the predetermined test temperature (about 100 degrees C.), external appearance confirmation of the probes 19 is performed (FIG. 6: Step S104). The external appearance confirmation of the probes 19 is carried out in the same manner as in the first embodiment, and therefore, a description thereof is omitted.

Since the temperature of the probes 19 is maintained at the temperature reached at the probe heating step (Step S103), it is possible to perform the external appearance confirmation of the probes 19 in a condition approximate to the actual use condition of the probes 19 (use condition in the prober 10). Thus, the external appearance confirmation of the probes 19 is performed with high precision.

Next, the position/posture adjustment of the probes 19 is performed while the temperature of the probes 19 is maintained at the test temperature (FIG. 6: Step S105). The position/posture adjustment of the probes 19 is carried out in the same manner as in the first embodiment using the glass mask 50, and therefore, a description thereof is omitted. Like the first embodiment, the position/posture adjustment of the probes 19 at this step S105 is performed at the same temperature as the wafer test temperature. Therefore, it is possible to perform accurate position/posture adjustment of the probes 19 in consideration of thermal expansion of the probe card 17 and probes 19 during the wafer test.

After the position/posture adjustment of all the defective probes 19 is completed (FIG. 6: Step S106), the probe cleaning is performed (FIG. 6: Step S107). The cleaning of the probes 19 is performed, for example, using a tool, such as a brush or a pincette, or using forced air, in the same manner as in the first embodiment. The cleaning of the probes 19 at this step S107 is also performed at the same temperature as the wafer test temperature. Thus, it is possible to easily remove foreign matter, such as metal pieces, attached to the probes 19 during the manufacture of the probes 19. It should be noted that additional heating at a higher temperature may be applied to the probes 19 if the cleaning at step S107 is insufficient.

The receiving test and adjustment (calibration) of the probe card 17 is completed through the above-mentioned steps S101 to S107. After Step S107, the probe card 17 may be mounted to the prober 10 in the same manner as in the first embodiment (FIG. 2). Alternatively, the probe card 17 may be stored at room temperature or high temperature (for example, 100° C. or higher) without being mounted to the prober 10.

According to the second embodiment, it is possible to accurately, rapidly, and easily perform the maintenance (probe inspection, probe position/posture correction and/or probe cleaning) of the probe card 17 without mounting the probe card 17 on or in the prober 10 or the like. That is, it is possible to find and correct the defective probes and remove foreign matter from the probes, i.e., perform the maintenance of the probes, before the probe card 17 is installed in the prober 10. Therefore, it is possible to install the "approved" probe card 17 in the prober 10.

It should be noted that Step S101 to Step S107 of the second embodiment may be performed before the shipping of the probe card 17 from the probe card supplier. This makes it possible to ship only the approved probe card 17.

This application is based on Japanese Patent Application No. 2009-25030 filed on Feb. 5, 2009 and the entire disclosure thereof is incorporated herein by reference.

What is claimed is:

1. A maintenance method of a probe card used in testing electrical properties of a wafer having integrated circuits formed thereon, the testing being performed at a predetermined test temperature, the probe card having a plurality of probes thereon, the plurality of probes having tip ends respectively, the maintenance method comprising:

heating the probe card and the plurality of probes to a first temperature that is determined based on the predetermined test temperature; and adjusting positions and postures of the probes while maintaining the temperature of the probe card and the probes at the first temperature, wherein said adjusting includes preparing a glass mask having a plurality of alignment marks indicating original positions and postures of the plurality of probes respectively, causing the glass mask to face the probe card, and adjusting the positions and postures of the probes such that the tip ends of the probes are aligned with the corresponding alignment marks.

2. The maintenance method according to claim 1 further comprising preparing a maintenance table equipped with a heater prior to said heating the probe card and the plurality of probes, wherein said heating the probe card and the plurality of probes includes placing the probe card on the maintenance table, and heating the probe card and the plurality of probes with the heater.

3. The maintenance method according to claim 2, wherein said testing is carried out in a testing apparatus, the maintenance table is located outside the testing apparatus, and the maintenance method further comprises removing the probe card from the testing apparatus prior to said placing the probe card on the maintenance table and returning the probe card to the testing apparatus after said adjusting positions and postures of the probes.

4. The maintenance method according to claim 3, wherein the wafer remains in the testing apparatus while the probe card is removed from the testing apparatus, and the maintenance method further comprises keeping the wafer at said predetermined test temperature until the probe card returns to the testing apparatus.

5. The maintenance method according to claim 4 further comprising heating the probe card to said predetermined test temperature after the probe card returns to the testing apparatus.

6. The maintenance method according to claim 2, wherein said maintenance table has a bottom wall and a lateral wall that define in combination a container with its top open, and said placing the probe card on the maintenance table includes closing the open top of the container by the probe card such that a closed space is created by the bottom wall and lateral wall of the maintenance table and the probe card.

7. The maintenance method according to claim 2, wherein said heating the probe card and the plurality of probes further includes bringing the heater into contact with the probe card after placing the probe card on the maintenance table.

8. The maintenance method according to claim 1 further comprising cleaning the probes before or after said heating the probe card and the plurality of probes, or after said adjusting the positions and postures of the probes.

9. The maintenance method according to claim 8 further comprising heating the probe card and the probes between said adjusting the positions and postures of the probes and said cleaning the probes.

10. The maintenance method according to claim 8, wherein said cleaning the probes includes applying forced air to the probes.

11. The maintenance method according to claim 8, wherein said cleaning the probes includes heating the probes.

12. The maintenance method according to claim 11, wherein said heating in said cleaning the probes includes heating the probes to a temperature higher than the test temperature.

13. The maintenance method according to claim 1 further comprising finding defective probes among the plurality of probes prior to said adjusting positions and postures of the probes, and wherein said defective probes are those probes whose tip ends are not in originally designed positions and postures, and said adjusting positions and postures of the probes is carried out to the defective probes only.

14. The maintenance method according to claim 1, wherein said predetermined test temperature is about 100 degrees C.

15. The maintenance method according to claim 1, wherein said heating includes heating the probe card and the plurality of probes to the same temperature as the predetermined test temperature.

16. A method of testing a wafer with a probe card, comprising:
   preparing a probe card having a plurality of probes thereon;
   preparing a wafer having integrated circuits formed thereon; and
   testing electrical properties of the wafer with the probe card, said testing being performed at a predetermined test temperature,
   wherein the probe card undergoes a maintenance method that includes
      heating the probe card and the plurality of probes to a first temperature that is determined based on the predetermined test temperature,
      preparing a glass mask having a plurality of alignment marks indicating original positions and postures of the plurality of probes respectively,
      causing the glass mask to face the probe card, and
      adjusting positions and postures of the probes such that tip ends of the probes are aligned with the corresponding alignment marks while maintaining the temperature of the probe card and the probes at said first temperature.

* * * * *